United States Patent
Wong et al.

(10) Patent No.: US 7,405,420 B1
(45) Date of Patent: Jul. 29, 2008

(54) METHOD AND SYSTEM FOR CHALCOGENIDE-BASED NANOWIRE MEMORY

(75) Inventors: H. S. Philip Wong, Stanford, CA (US); Stefan Meister, Stanford, CA (US); SangBum Kim, Stanford, CA (US); Hailin Peng, Stanford, CA (US); Yuan Zhang, Stanford, CA (US); Yi Cui, Sunnyvale, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/541,464

(22) Filed: Sep. 29, 2006

(51) Int. Cl.
*H01L 47/00* (2006.01)

(52) U.S. Cl. .............................. 257/4; 257/2; 257/200; 257/734; 257/E31.029; 438/131; 977/940; 977/943

(58) Field of Classification Search .................. None
See application file for complete search history.

(56) References Cited

U.S. PATENT DOCUMENTS

| | | | |
|---|---|---|---|
| 5,997,832 A | 12/1999 | Lieber et al. | |
| 6,036,774 A | 3/2000 | Lieber et al. | |
| 6,965,521 B2 | 11/2005 | Li et al. | |
| 6,996,147 B2 * | 2/2006 | Majumdar et al. | 372/43.01 |
| 7,012,273 B2 | 3/2006 | Chen | |
| 7,038,230 B2 | 5/2006 | Chen et al. | |
| 7,082,051 B2 | 7/2006 | Ha et al. | |
| 2006/0034116 A1 * | 2/2006 | Lam et al. | 365/151 |

OTHER PUBLICATIONS

Stefan Meister et al. "Synthesis and Characterization of Phase-Change Nanowires." *NanoLetters*. American Chemical Society (Jun. 2006).

* cited by examiner

*Primary Examiner*—A. Sefer
*Assistant Examiner*—Scott R. Wilson
(74) *Attorney, Agent, or Firm*—Crawford Maunu PLLC (57) ABSTRACT

Chalcogenide-based nanowire memories are implemented using a variety of methods and devices. According to an example embodiment of the present invention, a method of manufacturing a memory circuit is implemented. The method includes depositing nanoparticles at locations on a substrate. Chalcogenide-based nanowires are created at the locations on the substrate using a vapor-liquid-solid technique. Insulating material is deposited between the chalcogenide-based nanowires. Lines are created to connect at least some of the chalcogenide-based nanowires.

15 Claims, 7 Drawing Sheets

METHOD AND SYSTEM FOR CHALCOGENIDE-BASED NANOWIRE MEMORY

FIELD OF THE INVENTION

The present invention relates generally to systems and approaches for phase-change memory, and more particularly to chalcogenide-based nanowire memory.

BACKGROUND

Personal computers and other devices use an assortment of memory storage devices. The ideal memory technology should combine high-speed, high-density, non-volatility and low power consumption. Chalcogenide memory is a promising next-generation memory that offers some of these advantages. The term chalcogenide memory is derived from the term for group VI elements of the periodic table also known as chalcogens. Chalcogens include several elements including oxygen, sulfur, selenium, tellurium and polonium. Chalcogenide memory is also referred to as phase-change memory or phase-change chalcogenide memory because the chalcogenide material can switch between a crystalline phase and an amorphous phase. Certain chalcogenide materials exhibit different electrical and optical properties based upon the phase of the material. These differences in properties can be used to represent data where reading the data includes detecting the differences using optical or electronic sensors.

Often, the phase of the chalcogenide material is controlled by applying heat to the material. The duration and amount of heat applied determines the phase of the chalcogenide material (i.e., crystalline or amorphous). One method of applying heat is through the use of electricity. Electrically induced amorphous-crystalline phase transition has been demonstrated to have high-speed (10 ns), long endurance ($10^{12}$ cycles), low programming energy, and excellent scaling characteristics. Moreover, chalcogenide memory is resistant to ionizing radiation effects. However, current phase-change memory circuits are limited in density due to, among other things, the size of a memory cell necessary for a single bit. Further information on chalcogenide memory circuits can be found in U.S. Pat. No. 6,965,521 to Li et al and U.S. Pat. No. 7,012,273 to Chen, which are fully incorporated herein by reference.

One of the components in determining the size of a memory cell is the size of the phase-change material. For example, larger phase-change material uses additional heat to create a change in phase. The increased heat creates issues with both the power efficiency of the memory device and thermal cross-talk. Thermal cross-talk is a problem that occurs when heat leaks from the memory cell being written to an adjacent memory cell. If the thermal cross-talk is great enough, the data in the adjacent memory cell can be corrupted. Power efficiency is also a factor for dense memory arrays due to issues related to supplying sufficient power to small devices, including issues due to leakage current and excessive heat.

These and other issues have presented challenges to the implementation and design of phase change memory devices, including those involving chalcogenide-based memory and similar applications.

SUMMARY

The claimed invention is directed phase-change memory arrangements and methods. The present invention is exemplified in a number of implementations and applications, some of which are summarized below.

Various example embodiments of the present invention are directed to a method of manufacturing a memory circuit. The method includes depositing nanoparticles at locations on a substrate. Chalcogenide-based nanowires are created at the locations on the substrate using a vapor-liquid-solid technique. Insulating material is deposited between the chalcogenide-based nanowires. Lines are created to connect at least some of the chalcogenide-based nanowires.

According to another example embodiment of the present invention a chalcogenide-based memory device is implemented. The device includes chalcogenide-based nanowires and a layer, between the chalcogenide-based nanowires, to provide at least some insulation therebetween. The device also includes a line electrically connected to at least some of the chalcogenide-based nanowires and a control circuit to control and to communicatively couple to at least one of the chalcogenide-based nanowires in order to access data.

According to another example embodiment of the present invention a method is implemented for use with a phase-change memory device having chalcogenide-based nanowires. The method includes impeding heat or electricity transfer between the chalcogenide-based nanowires using an insulating layer and heating at least one of the chalcogenide-based nanowires to store data. Additionally, the method involves reading stored data from at least one of the chalcogenide-based nanowires using a line electrically connected to at least some of the chalcogenide-based nanowires.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be useful for a variety of different applications, and the invention has been found to be particularly suited for use in chalcogenide-based nanowire memory arrangements and methods. While the present invention is not necessarily limited to such applications, various aspects of the invention may be appreciated through a discussion of various examples using this context.

Consistent with one example embodiment of the present invention, a chalcogenide-based memory array is manufactured. Nanoparticles are used to control the growth of chalcogenide-based nanowires by depositing the nanoparticles on a substrate. In one instance, the nanoparticles are deposited as an array that corresponds to row lines found on the substrate. Chalcogenide-based nanowires are grown at the site of the deposited nanoparticles using a vapor-liquid-solid technique. Insulating material is then deposited between the nanowires. Column lines are then formed to electrically connect the nanowires.

Consistent with another example embodiment of the present invention, a chalcogenide-based memory device is implemented. The memory device includes chalcogenide-based nanowires, which can be used to store data. An insulating layer separates the chalcogenide-based nanowires from one another. A line electrically connects at least some of the chalcogenide-based nanowires to each other. A control circuit controls at least one of the chalcogenide-based nanowires for accessing data stored therein.

In yet another embodiment of the present invention, a method is used with a phase-change memory device having chalcogenide-based nanowires. An insulating layer impedes heat or electricity transfer between the chalcogenide-based nanowires. A resistor or similar element heats at least one of the chalcogenide-based nanowires to store data. A circuit reads stored data from at least one of the chalcogenide-based nanowires using a line electrically connected to at least some of the chalcogenide-based nanowires.

In one instance the chalcogenide-based nanowires are arranged in an array, similar to existing memory circuits. For example, the nanowires can be inter-connected using column and row lines. The nanowires store information based upon their physical state, which corresponds to the effective resistance of the nanowires. Thus, the data can be read by determining the effective resistance of the nanowires using a current/voltage applied to the nanowires through the column and row lines.

The physical state, and thus the data stored, can be altered by the control of heat applied to the nanowires. For example, a chalcogenide-based nanowire can be said to be in a reset state after it is heated above the melting temperature of the nanowire and cools down quickly. The reset state corresponds to the nanowire having a relatively uneven crystallized state (e.g., an amorphous state), and accordingly, less free carriers. As a result, the resistance of the nanowire is relatively high. In another example, a chalcogenide-based nanowire can be said to be in a set state after it is heated above the crystallization temperature of the nanowire for a relatively long period of time. This set state corresponds to the nanowire having a relatively uniform crystallized state, and accordingly, more free carriers. As a result, the resistance of the nanowire is relatively low.

In one embodiment, the nanowires are constructed having a diameter of about 10 nm or less. This is particularly useful for dense memory arrays, power reduction and increase programming speeds because reducing the mass of a material reduces the amount of energy required to heat the material to a given temperature. Accordingly, the nanowires can be heated faster while using less power.

In another embodiment of the present invention, the nanowires are constructed using a vapor-liquid-solid growth (VLS) mechanism. Examples of VLS growth mechanisms are described in U.S. Pat. No. 6,996,147 to Majumdar, et al, U.S. Pat. No. 5,997,832 to Lieber, et al, U.S. Pat. No. 6,036,774, to Lieber, et al, which are fully incorporated herein by reference. Such mechanisms are an additive process and can be particularly useful for avoiding issues associated with other subtractive nanowire formation mechanisms. For example, some subtractive nanowire formation mechanisms require etching small holes. Such mechanisms can exhibit problems relating to etching and depositing nanowire material in the etched holes.

Figure 1:
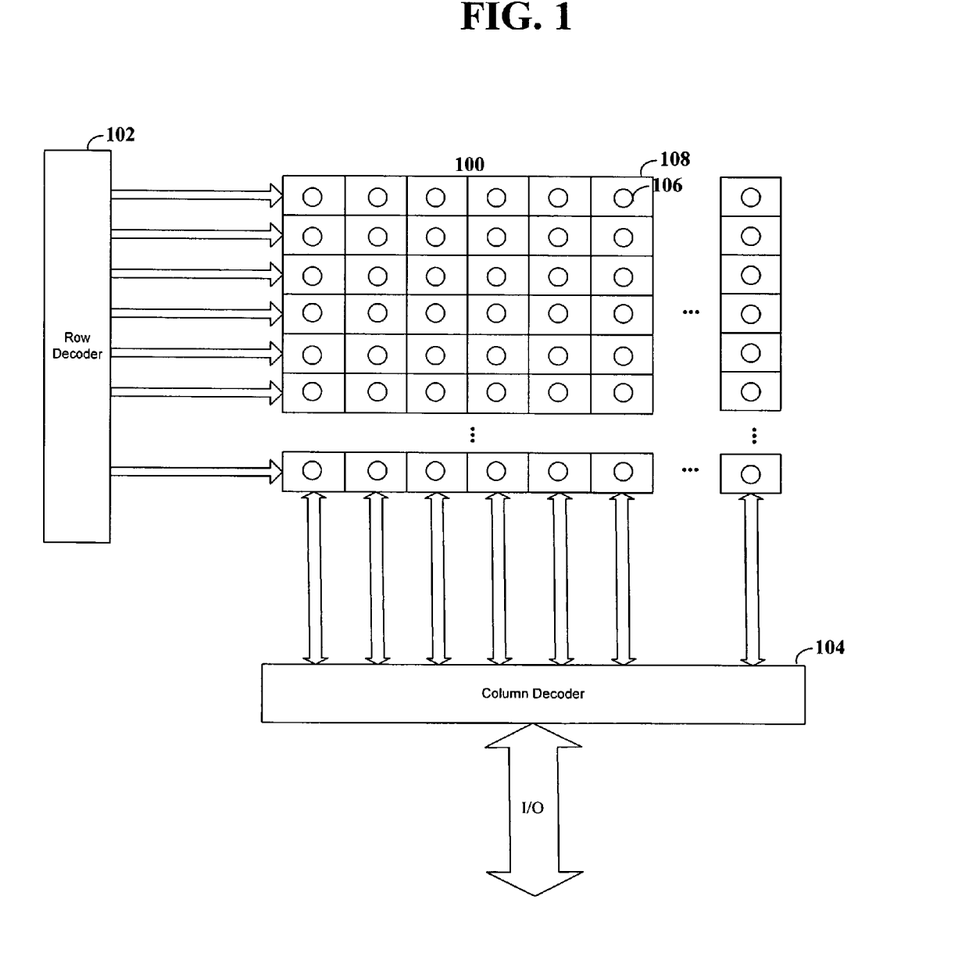
FIG. 1 shows a block diagram of a chalcogenide-based nanowire memory array, according to an example embodiment of the present invention.

Turning now to the figures, FIG. 1 shows a block diagram of a memory array of chalcogenide-based nanowires, according to an example embodiment of the present invention. Memory array 100 includes memory cell 108 and chalcogenide-based nanowire 106. Such a memory array can be implemented in a memory chip or integrated circuit (IC). The bits in a memory chip can be either individually addressable or addressable in groups.

Column and row decoders 102 and 104, respectively, are connected to electrical interconnections between the memory cells of memory array 100. In one instance, column decoder 104 electrically energizes a column line in response to a memory address provided as part of a memory access request, and row decoder 102 energizes a row line that also corresponds to the memory address. In this manner, a single memory cell can be accessed. In another instance, row decoder 102 energizes a word-line that provides access to each memory cell in the word-line. In the case of a read, column decoder 104 receives data from each memory cell in the word-line. Column decoder 104 acts as a multiplexer that selects data from one or more memory cell to output onto the I/O bus. For example, if the output bus is N bits and memory array 100 is M bits, column decoder 104 receives M bits from an active row and selects N bits based upon the address request. In the case of a write, column decoder 104 receives N bits from the I/O bus and drives N bits of the M bits, where the N bits correspond to a currently active word-line and column address bits.

Additional circuitry can be implemented at each memory cell to facilitate the reading and writing of each memory cell. For instance, various transistor logic gates (e.g., diodes, field-effect transistors, CMOS gates) can be implemented at each cell (or for a block of cells) to increase drive strength at the desired memory cell and to control the selection of individual memory cells. In another instance, additional circuitry can be implemented to compensate for faulty memory cells by bypassing the faulty memory cells. In such an instance, the memory array can be checked for faulty memory cells and in response the additional circuitry effectively disables the faulty memory cells.

Figure 1A:
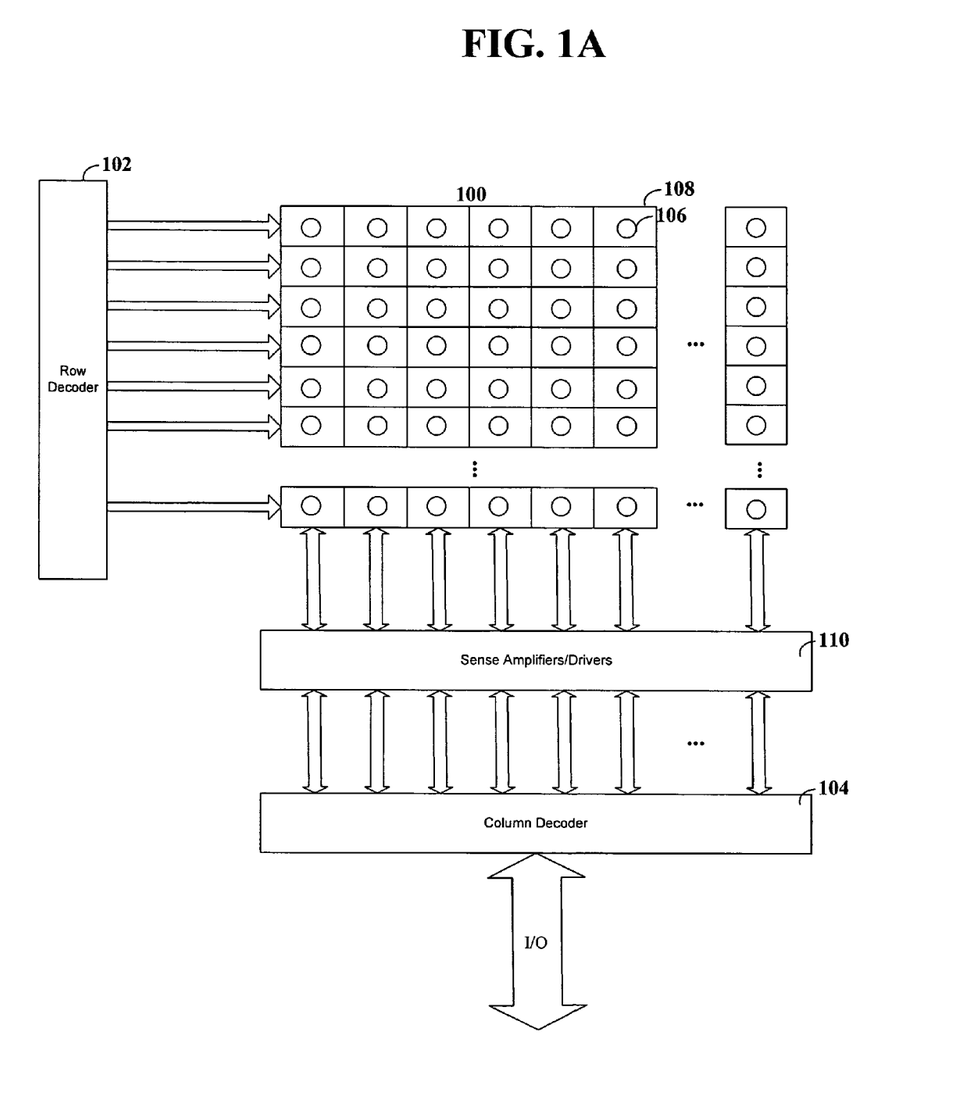
FIG. 1A shows a block diagram of a chalcogenide-based nanowire memory array, according to an example embodiment of the present invention.

FIG. 1A shows a block diagram of a memory array of chalcogenide-based nanowires, according to an example embodiment of the present invention. FIG. 1A is similar to FIG. 1 with the exception of the addition of sense amplifiers/ drivers block 110. During a read operation, this block functions to amplify data received from an active word-line. For example, an active word-line may apply a current to each memory cell 108 of a given row producing a voltage at each memory cell 108 that corresponds to the resistive characteristics of the chalcogenide nanowires. Sense block 110 receives the data in the form of the produced voltages and amplifies the received data. During a write operation, block 110 functions to drive the appropriate bit lines according to the data received from column decoder 104. In addition, block 110 controls the power applied to each element according to the data received. For instance, block 110 can provided a shorter application of power to generate a high-ohmic state and a longer application of power to generate a low-ohmic state.

In a particular embodiment, chalcogenide nanowire 106 includes a diode portion. The diode portion of nanowire 106 is constructed, for example, using a p/n-junction. The value of the resistive element can be read by applying a forward-bias current/voltage to the nanowire. Programming can be accomplished by applying a reverse bias current/voltage to the nanowire. For example, a voltage is applied to a word line that is less than the breakdown voltage when referenced to a non-active column line. Thus, power dissipation is minimal for non-active memory cells because the diode is reversed biased and the voltage does not exceed the breakdown voltage. For an active column line, a voltage is applied that is less than the breakdown voltage when referenced to a non-active row line, but that is greater than the breakdown voltage when referenced to an active row line. This is particularly useful for minimizing power dissipation and for limiting current/voltage leakage between row and column lines. In one embodiment, an array of memory ICs can be used in a memory system.

In another embodiment, each chalcogenide memory cell can be made addressable using transistor-based or similar circuits. In one such instance, one or more field-effect transistors can be used to control access to each chalcogenide memory cell. This can be useful for uniquely accessing each memory cell and for reducing the current on the memory cell enabling lines (e.g., word lines) because the gate current of the transistor can be significantly less than the drive current applied to the memory element. One skilled in the art would recognize that memory systems can be constructed using a number of different existing arrangements and configurations using a chalcogenide-based nanowire memory element. For instance, example phase-change memory systems are taught by U.S. Pat. No. 7,038,230 to Chen, et al, and U.S. Pat. No. 7,082,051 to Ha, et al, which are fully incorporated herein by reference. Thus, these and other similar memory systems can be modified to include chalcogenide-based nanowires. In the one such modification of existing memory systems, a chalcogenide memory element (e.g., thin film chalcogenide layer) is replaced with a chalcogenide-based nanowire memory element that is consistent with the teachings herein.

Figure 2A:
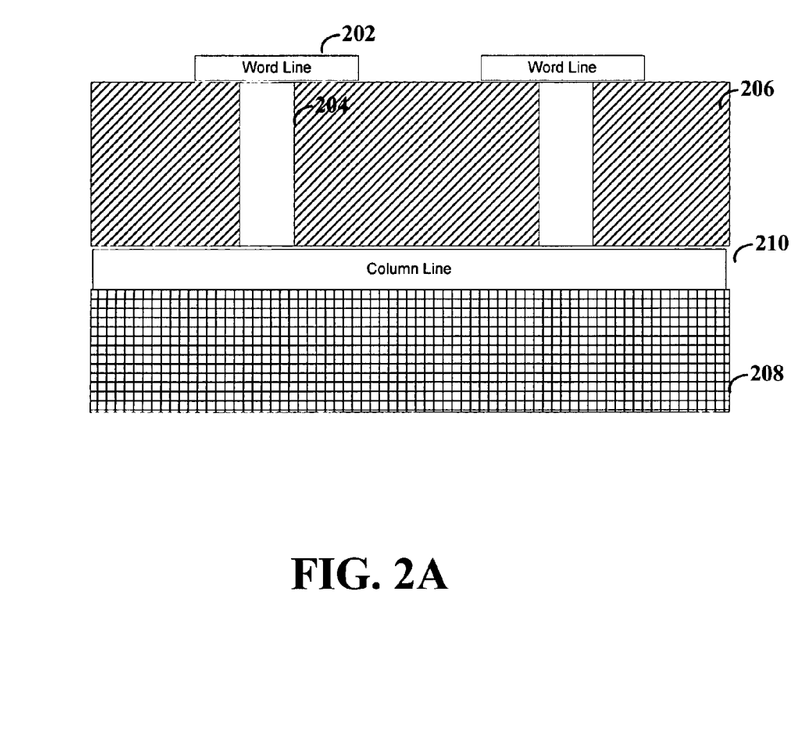
FIG. 2A shows a diagram of a chalcogenide-based nanowire memory arrangement, according to an example embodiment of the present invention.

FIG. 2A shows a diagram of a chalcogenide-based-memory arrangement, according to an example embodiment of the present invention. FIG. 2 includes substrate 208, word line 202, chalcogenide-based nanowire 204, insulating layer 206 and column line 210. Word line 202 electrically connects a row driver to one end of chalcogenide-based nanowire 204, while column line 210 electrically connects the other end of chalcogenide-based nanowire 204 to a column driver. Thus, chalcogenide-based nanowire 204 is addressable by the selection of column line 210 and word line 202. Word line 202 and column line 210 can be constructed out of any suitable conductive material. Substrate 208 includes a suitable material, such as various silicon substrate materials currently used in integrated circuits.

Insulating layer 206 provides thermal and electrical insulation between chalcogenide-based nanowires. Insulating layer 206 can be constructed using various different materials and combinations of materials, such as one or more silicon oxides and polymers with low thermal conductivity. Selection of a suitable insulating material may include factors such as cost of the material, ease of manufacture, electrical properties, thermal properties and durability of the material.

Figure 2B:
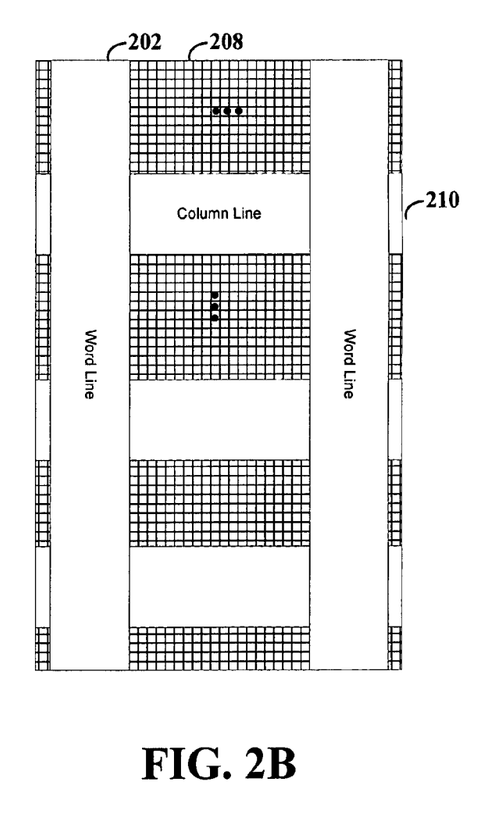
FIG. 2B shows a diagram of a top-down view of a chalcogenide-based nanowire memory arrangement, according to an example embodiment of the present invention.

FIG. 2B shows a top-down view of the FIG. 2A diagram, according to an example embodiment of the present invention. More specifically, FIG. 2B shows the how the column lines and row/word lines form an intersecting grid or array as shown by the intersection of column line 210 and word line 202 on substrate 208.

Figure 3:
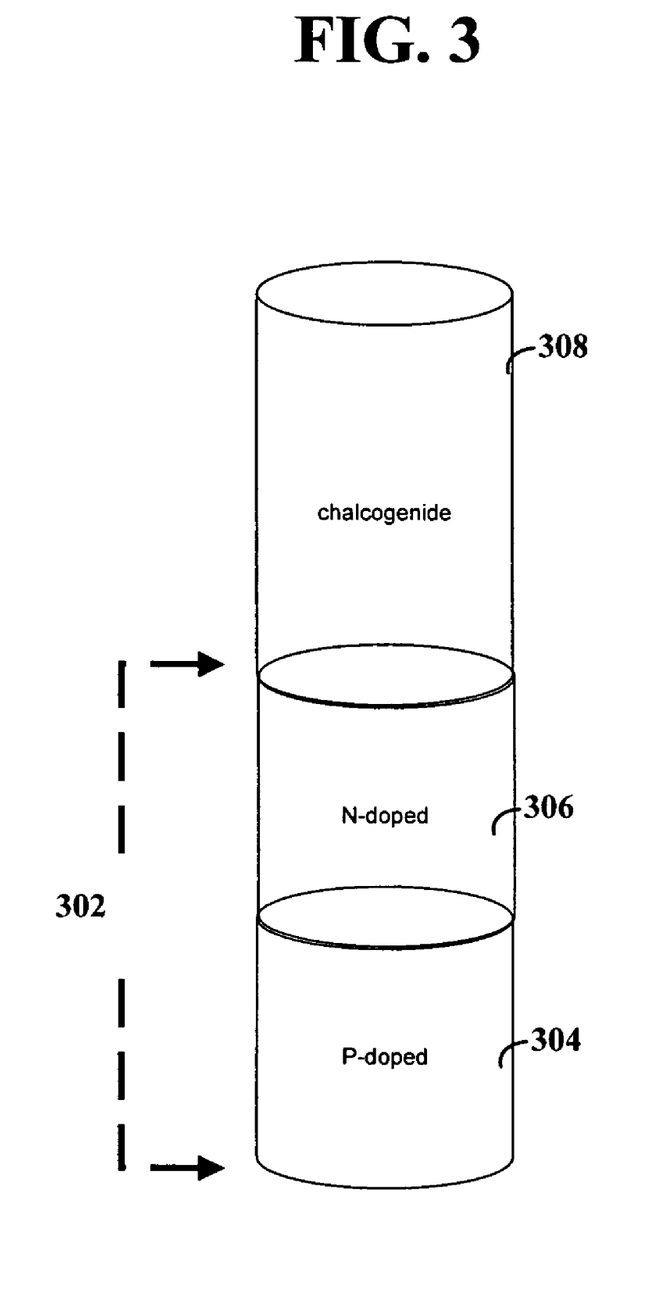
FIG. 3 shows an example chalcogenide-based nanowire, according to an example embodiment of the present invention.

FIG. 3 shows an example chalcogenide nanowire, according to an example embodiment of the present invention. FIG. 3 shows current controlling hetero-structure 302 and chalcogenide-based section 308. In a particular embodiment, section 302 includes p-doped section 304 and n-doped section 306. Other current controlling structures are possible, such as those structures using various other semiconductor or similar materials. In the case of doped semiconductor, the sections can be constructed using an epitaxial growth of in-situ p/n-doped silicon. The p/n-junction operates as a nanowire diode, and thus, can be used to form diode addressable phase change cross-point memory cells. The particular order of the p/n-doped silicon portions of the nanowire can be interchanged based upon the desired system because such a change only changes the forward and reverse bias direction of the diode. Such a change can be accommodated by configuring the row and column drivers for the corresponding bias direction.

Figure 4:
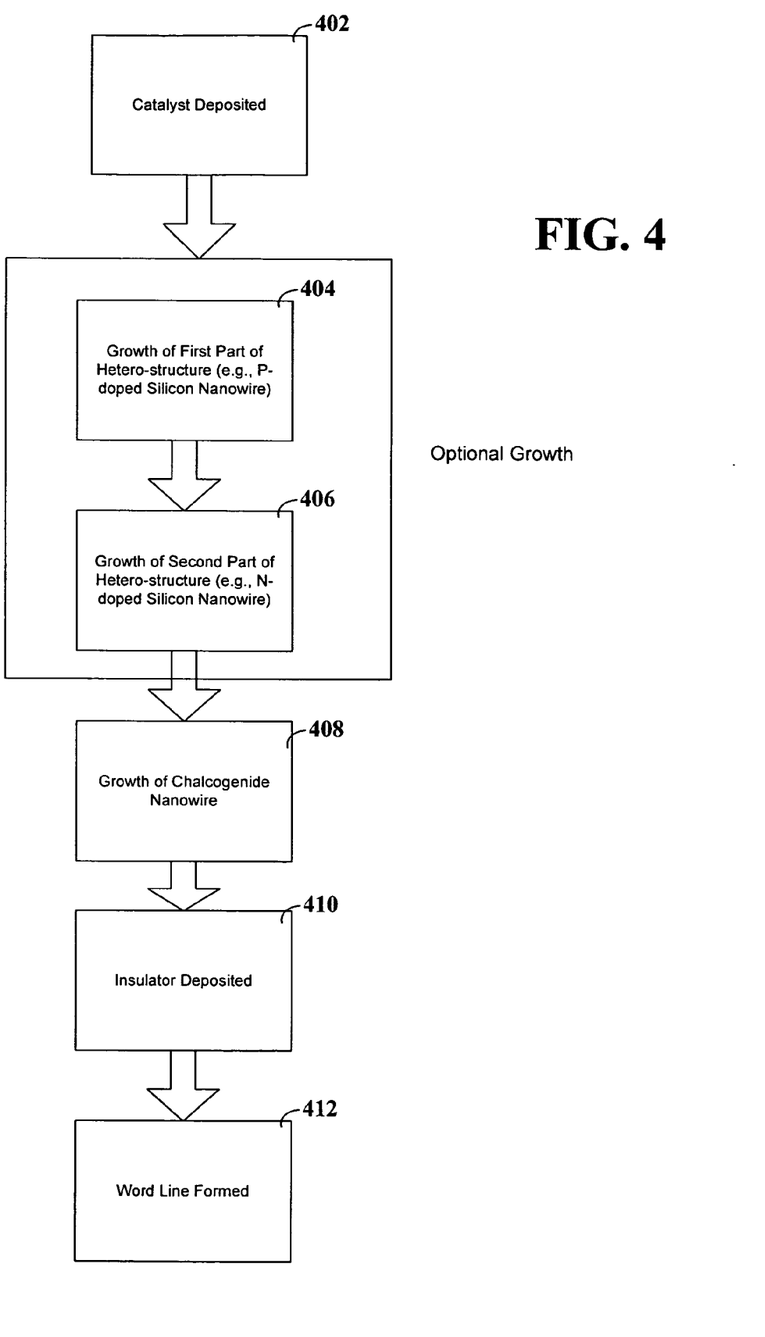
FIG. 4 shows block diagram for a chalcogenide-based nanowire method, according to an example embodiment of the present invention.

FIG. 4 shows block diagram for a chalcogenide-based nanowire method, according to an example embodiment of the present invention. FIG. 4 shows block 402-412, which represent steps that can be followed to create a chalcogenide-based memory cell.

In one embodiment of the present invention, catalysts for the growth of a chalcogenide-based nanowire are deposited on a substrate, as shown by block 402. The catalysts can be, for example, gold nanoparticles or other nanoparticles that exhibit sufficient solvation power for each element of the nanowire. In one instance, the nanoparticles are deposited into an array using a capillary force assembly technique.

In one instance, an optional current controlling hetero-structure section (e.g., a p/n junction) is grown for the chalcogenide nanowire. For such an instance, VLS growth mechanism is used to produce an epitaxial growth of in-situ p-doped silicon nanowire as shown by block 404. Due to the VLS growth process, the catalyst nanoparticles remain at the exposed portion of the nanowire. Accordingly, a VLS growth mechanism can subsequently be used to produce an epitaxial growth of in-situ n-doped silicon nanowire as shown by block 406.

A VLS growth mechanism is used to produce a chalcogenide nanowire as shown by block 408. If the optional diode steps have been implemented, the chalcogenide growth can be assisted by a change of the growth precursor.

An oxide, polymer or other suitable insulating layer is deposited between the chalcogenide-based nanowires as shown by step 410. Using some deposition methods the nanowire will be covered by the insulating material and thus not accessible for connection to a word line. Thus, the insulating material (and the catalyst nanoparticles) can be removed using, for example, a polish-back mechanism with a chemical-mechanical polisher (CMP). In one instance, a word line can then be formed to electrically connect one or more chalcogenide nanowires as shown in block 412.

Various modifications can be made to the steps shown by FIG. 4, including modifying the order of the p/n junction and chalcogenide growth steps 404-408 and growing the chalcogenide portion prior to the p/n junction growth.

Figure 5:
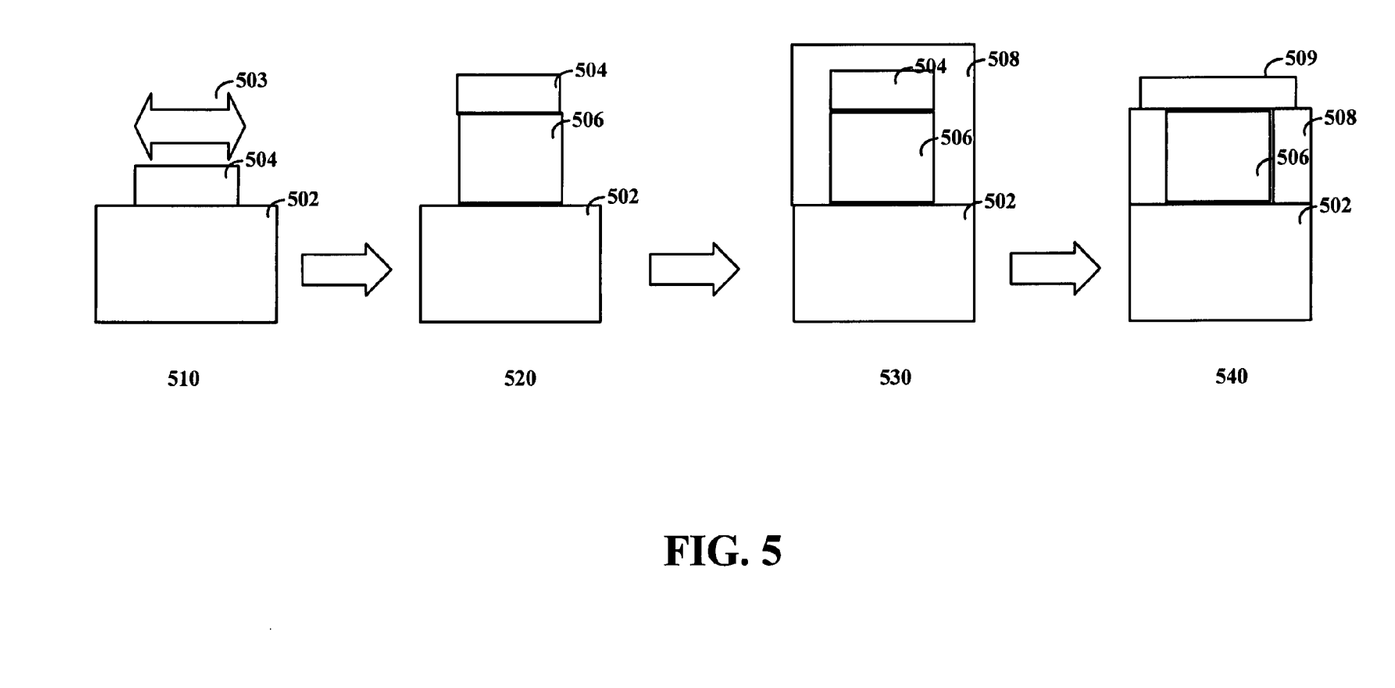
FIG. 5 shows manufacturing stages for producing a chalcogenide-based nanowire memory cell, according to an example embodiment of the present invention.

FIG. 5 shows various manufacturing stages of a chalcogenide-based nanowire memory cell, according to an example embodiment of the present invention. More specifically, FIG. 5 shows stages 510, 520, 530 and 540, which correspond to stages of manufacturing the memory cell.

Stage 510 shows substrate 502 and deposited nanoparticle catalysts 504. Deposited nanoparticles 504 have a diameter 503 that has a direct effect upon the resulting nanowire diameter. In one instance, the diameter is less than about 50 nm. Stage 520 shows a nanowire structure 506 produced using a VLS mechanism and having nanoparticle catalyst 504. In one embodiment of the present invention, additional stages can be added to produce a diode addressable nanowire as discussed in relation to the steps of FIG. 4. Stage 530 shows the addition of insulating material 508. Stage 540 shows the memory cell after the removal of a portion of insulating material 508 and catalyst 504. In addition, stage 540 shows a word line 509.

In a specific embodiment of the present invention, a particular VLS mechanism is used. For example, on the embodiment exploits VLS growth of Ge2Sb3Te2, GeTe (GT) and Sb2Te3 (ST) phase-change NWs with Au nanoparticles (nanocrystals) as catalysts. The family of Ge—Sb—Te (GST) materials can be used for phase change memory devices due to their rapid reversible change between crystalline and amorphous states at temperatures compatible with those of device applications (for Ge2Sb2Te5, melting point 610° C., glass transition temperature 350° C.). GT and ST are the two example members of this family of materials that can function as the basis to fabricate GST ternary alloys. GT and ST have melting points of 724 and 630° C., and amorphous phase crystallization temperatures of 145 and 77° C., respectively.

Figure 6:
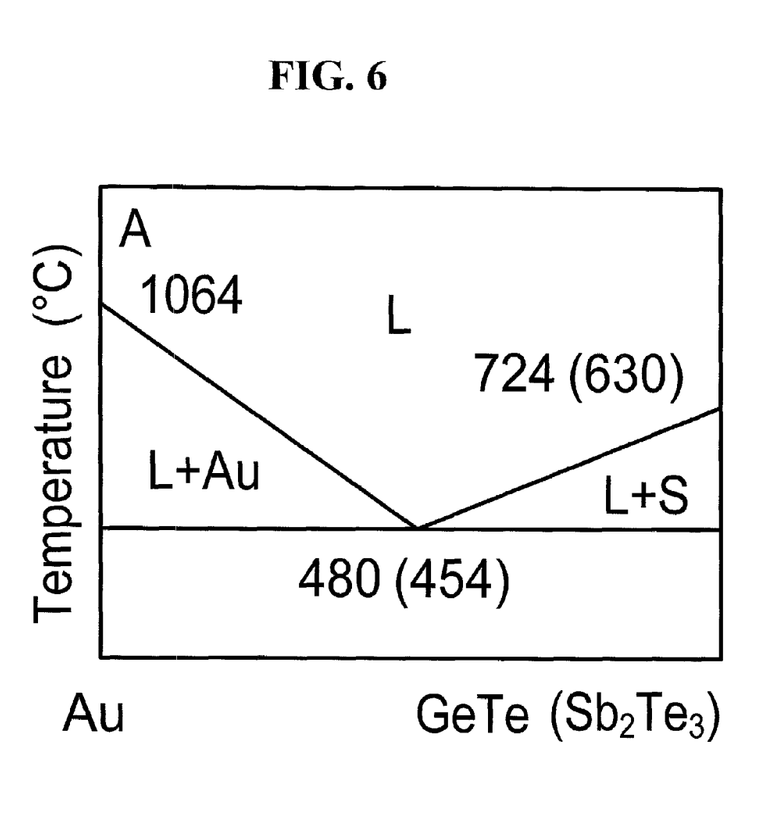
FIG. 6 shows a phase diagram of example materials involved in a chalcogenide-based nanowire, according to an example embodiment of the present invention.

Other catalysts and phase change materials are possible. To determine the possibility of a VLS growth with a particular catalyst, the phase diagrams of the materials involved can be observed. As shown in FIG. 6, GT and ST have a relatively simple bulk quasi-binary phase diagram with Au. The eutectic temperatures are at 480 and 454° C., respectively. Such a phase diagram analysis can be used to show that it is possible to use specific nanoparticles for VLS growth of phase change NWs. Due to the small size of nanoparticles, the eutectic temperature might be lower than the bulk value.

In a particular embodiment of the present invention, nanowires are grown on silicon substrates with a native oxide. Nanoparticle catalysts are deposited using a 50 run diameter Au colloid solution. The negatively charged Au nanoparticles stick to positively charged locations, such as poly-L-lysine. The substrates are placed downstream in a 1 in. diameter horizontal tube furnace with the source material, finely ground GT (Alfa Aesar, 99.999%) or ST (Alfa Aesar, 99%), placed in the hot center region. A 5% H2 in N2 gas mixture acts as a carrier gas to transport the vapor to the colder furnace region. Before each growth mechanism, the quartz tube of the furnace can be evacuated to <100 mTorr and flushed with the carrier gas repeatedly to decrease oxygen contamination. Germanium telluride NWs are grown at ~50 Torr and ST NWs are grown at 1 atm pressure. Example parameters for the NW synthesis are as follows: temperature T=450° C., duration time t=1-6 hours, and carrier gas flow rate=150 sccm. Antimony telluride NWs tend to grow preferentially within 10 cm of the hot center region of the furnace, where the temperature is ~440° C. and the best GT NW growth tends to be achieved in the colder region within 5-10 cm of the furnace end with a temperature of 370° C. Samples can also be grown on 50 nm thick Si3N4 membranes for further studies with a transmission electron microscope (TEM).

Three types of morphologies can be grown using such a mechanism. The first type (type I) consists of long and straight NWs with diameters in the range of 50-200 nm and lengths up to tens of micrometers. The second type (type II) is the helical structures with diameters of 50-200 nm and lengths up to tens of micrometers. The helical pitch is 200-400 nm. Type I and II NWs have a very similar diameter and length distribution. The straight and helical structures can coexist in the same NWs, suggesting that type I and II have the same chemical composition and crystal structure. It is also noted that the helical NWs can change their pitch by having a sharp turn. A three-dimensional helical structure can also become a nearly two-dimensional zigzag structure. Both left- and right-handed helical NWs can be found. The third type (type III) consists of thin and curly NWs below type I and II and is mostly close to the substrate surface. Type III has a narrow diameter distribution centered at ~35 nm, which is smaller than the size of 50 nm diameter Au nanoparticles. The length of this type is approximately several micrometers. Each type of NW accounts for a significant fraction of the final products.

The size of Au nanoparticles and the growth conditions including gas pressure and temperature can be used to control the NW size. In one instance, the mechanism results in an atomic percentage of 51% and 49% for Ge and Te, respectively. Thus, the chemical composition for type I and II NWs is GeTe.

For type III NWs, a focused electron beam can drill holes into the NWs within several seconds. Thus it is possible to control the structure of these NWs using an electron beam. The atomic ratio of Ge to O is calculated to ~2. This ratio suggests that type III NWs are amorphous GeO2. The mean NW diameter is ~35 nm, which is smaller than the initial Au nanoparticle size. Such a difference might be due to the wetting properties between Au and GeO2. The interface between the Au and NWs is curvy rather than flat like type I and II NWs. This effectively changes the shape of Au nanoparticle from nearly spherical into elliptical. Thus, the NW diameters are controlled by the short axis of the Au and are smaller than the initial Au size.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include the use of use of materials other than Au nanoparticles and GeTe or SbTe phase change materials. Such modifications and changes do not depart from the true spirit and scope of the present invention, which is set forth in the following claims.

What is claimed is:

1. A chalcogenide-based memory device comprising:
   chalcogenide-based nanowires;
   a layer, between the chalcogenide-based nanowires, to provide at least some insulation therebetween;
   a line electrically connected to at least some of the chalcogenide-based nanowires; and
   a control circuit to control and to communicatively couple to at least one of the chalcogenide-based nanowires for accessing data.

2. The device of claim 1, wherein the control circuit is to communicatively couple to at least one of the chalcogenide-based nanowires for storing data by applying a change in temperature of said at least one chalcogenide-based nanowire.

3. The device of claim 1, wherein the control circuit is to communicatively couple to at least one of the chalcogenide-based nanowires for reading data by application of an electrical parameter to said at least one chalcogenide-based nanowire.

4. The device of claim 1, wherein the chalcogenide-based nanowires include a chalcogenide-based portion and a current controlling hetro-structure.

5. The device of claim 4, wherein the current controlling hetro-structure includes a p-doped silicon portion and an n-doped silicon portion, and said at least some insulation between the chalcogenide-based nanowires includes thermal insulation and electrical insulation.

6. The device of claim 1, wherein the chalcogenide-based memory device comprises an array of chalcogenide-based nanowires, wherein each chalcogenide-based nanowires is used to store data corresponding to phase states of the chalcogenide-based nanowires.

7. The device of claim 5, wherein the chalcogenide-based memory device further comprises column lines to electrically connect the array of chalcogenide-based nanowires.

8. The device of claim 1, wherein the chalcogenide-based nanowires are constructed using one of Ge2Sb3Te2, GeTe and $Sb_2Te_3$.

9. The device of claim 1, wherein the layer is a silicon oxide.

10. The device of claim 1, wherein the chalcogenide nanowires are less than about 10 nanometers in diameter.

11. The device of claim 6, wherein the array of chalcogenide-based nanowires is addressable using row and column decoders.

12. A memory device comprising:
    means, including chalcogenide-based nanowires, for providing access to data, for providing at least some insulation between the chalcogenide-based nanowires, and for interconnecting to at least some of the chalcogenide-based nanowires; and
    means for controlling and for communicatively coupling to the chalcogenide-based nanowires.

13. For use with a phase-change memory device having chalcogenide-based nanowires, a method comprising:
    impeding heat or electricity transfer between the chalcogenide-based nanowires using an insulating layer;
    heating at least one of the chalcogenide-based nanowires to store data; and
    reading stored data from at least one of the chalcogenide-based nanowires using a line electrically connected to at least some of the chalcogenide-based nanowires.

14. The method of claim 13, wherein the step of heating stores data by heating the at least one of the chalcogenide-based nanowires using at least one of multiple temperature cycles indicative of data to be stored.

15. The method of claim 13, wherein the step of reading stored data uses a diode-addressable chalcogenide-based nanowire.

* * * * *